(12) United States Patent
Okamoto

(10) Patent No.: US 10,333,236 B2
(45) Date of Patent: Jun. 25, 2019

(54) BATTERY WIRING MODULE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Ryouya Okamoto, Mie (JP)

(73) Assignees: AutoNetworks Technologies, Ltd. (JP); Sumitomo Wiring Systems, Ltd. (JP); Sumitomo Electric Industries, Ltd. (JP)

( * ) Notice: Subject to any disclaimer, the term of this patent is extended or adjusted under 35 U.S.C. 154(b) by 70 days.

(21) Appl. No.: 15/528,869

(22) PCT Filed: Dec. 3, 2015

(86) PCT No.: PCT/JP2015/084010
§ 371 (c)(1),
(2) Date: May 23, 2017

(87) PCT Pub. No.: WO2016/098607
PCT Pub. Date: Jun. 23, 2016

(65) Prior Publication Data
US 2018/0331440 A1 Nov. 15, 2018

(30) Foreign Application Priority Data
Dec. 17, 2014 (JP) .................................. 2014-255154

(51) Int. Cl.
*H01R 24/00* (2011.01)
*H01R 33/00* (2006.01)
(Continued)

(52) U.S. Cl.
CPC ............ *H01R 11/288* (2013.01); *H01M 2/10* (2013.01); *H01M 2/20* (2013.01); *H01M 2/206* (2013.01);
(Continued)

(58) Field of Classification Search
CPC ..... H01R 13/58; H01R 11/288; H01M 2/206; H01M 2/10482
(Continued)

(56) References Cited

U.S. PATENT DOCUMENTS 8,449,333 B2 *  5/2013  Ikeda ................. H01M 2/1061
                                                        439/627
8,563,161 B2 * 10/2013  Ogasawara ......... H01M 2/1072
                                                        429/121
(Continued)

FOREIGN PATENT DOCUMENTS

JP    2012-164591    8/2012
JP    2012-252781    12/2012
(Continued)

OTHER PUBLICATIONS

International Search Report dated Mar. 8, 2016.

*Primary Examiner* — Edwin A. Leon
*Assistant Examiner* — Milagros Jeancharles
(74) *Attorney, Agent, or Firm* — Gerald E. Hespos; Michael J. Porco; Matthew T. Hespos

(57) ABSTRACT

A battery wiring module to be mounted on a unit cell group formed by arranging a plurality of unit cells including positive and negative electrode terminals includes a terminal to be electrically connected to the electrode terminal, a detection wire for detecting a state of the unit cell by being electrically connected to the terminal, and a resin protector including a terminal accommodating portion for accommodating the terminal, a wire accommodation groove for (Continued)

accommodating the detection wire and a through groove allowing communication between the terminal accommodating portion and the wire accommodation groove and used to pull out the detection wire connected to the terminal into the wire accommodation groove. The detection wire is bent at least at two or more positions in the wire accommodation groove or the through groove and held in a bent state while being routed in the resin protector.

2 Claims, 20 Drawing Sheets

(51) Int. Cl.
*H01R 11/22* (2006.01)
*H01R 11/28* (2006.01)
*H01M 2/10* (2006.01)
*H01M 2/20* (2006.01)
*H01R 13/58* (2006.01)
*H01M 10/48* (2006.01)
*G01R 31/364* (2019.01)

(52) U.S. Cl.
CPC .......... *H01M 10/482* (2013.01); *H01R 13/58* (2013.01); *H01R 13/5833* (2013.01); *G01R 31/364* (2019.01); *H01M 2/1077* (2013.01); *H01M 2220/20* (2013.01)

(58) Field of Classification Search
USPC ............... 439/627, 500, 754, 456, 459, 465
See application file for complete search history.

(56) References Cited

U.S. PATENT DOCUMENTS

| | | | |
|---|---|---|---|
| 8,999,552 B2* | 4/2015 | Ogasawara | H01R 9/226 429/121 |
| 9,039,454 B2* | 5/2015 | Ogasawara | H01R 9/226 439/500 |
| 9,083,098 B2* | 7/2015 | Nakayama | H01M 2/20 |
| 9,780,351 B2* | 10/2017 | Shimoda | H01M 2/12 |
| 9,905,833 B2* | 2/2018 | Nishimura | H01M 2/206 |
| 2002/0086578 A1* | 7/2002 | Ikeda | H01M 2/1077 439/500 |
| 2012/0183833 A1* | 7/2012 | Ikeda | H01M 2/1077 429/121 |
| 2012/0231638 A1* | 9/2012 | Ikeda | H01M 2/1077 439/77 |
| 2013/0010449 A1* | 1/2013 | Ikeda | H02G 3/0437 361/826 |
| 2013/0147463 A1* | 6/2013 | Takase | G01R 31/3696 324/117 R |
| 2013/0171495 A1 | 7/2013 | Ogasawara et al. | |
| 2015/0010808 A1* | 1/2015 | Shoji | H01M 2/206 429/158 |
| 2015/0024634 A1 | 1/2015 | Nakayama | |
| 2015/0372465 A1* | 12/2015 | Nakayama | H01M 2/206 174/74 R |
| 2017/0328783 A1* | 11/2017 | Okamoto | G01K 1/14 |
| 2017/0352859 A1* | 12/2017 | Okamoto | H01M 2/34 |

FOREIGN PATENT DOCUMENTS

| | | |
|---|---|---|
| JP | 2013-97962 | 5/2013 |
| JP | 2013-143333 | 7/2013 |
| JP | 2015-210912 | 11/2015 |

* cited by examiner

BATTERY WIRING MODULE

BACKGROUND

1. Field of the Invention

This specification relates to a battery wiring module.

2. Description of the Related Art

Unit cells having positive and negative electrode terminals are arranged side by side in a battery module for electric or hybrid vehicle and a battery wiring module is used to electrically connect these unit cells. The battery wiring module is, for example, formed such that busbars for connecting adjacent positive electrode terminals and negative electrode terminals are held collectively on a base plate made of synthetic resin.

In the battery module of this type, a state of each unit cell is detected. As an example, Japanese Unexamined Patent Publication No. 2013-97962 discloses a configuration for overlapping a plurality of detection terminals connected to detection wires for measuring a terminal voltage of each unit cell with the individual busbars, drawing the detection wires out of the battery wiring module and performing voltage detection such as by an ECU.

In such a battery wiring module, the detection terminal connected to the detection wire may be displaced if the detection wire is pulled from outside with a strong force. A detection terminal that is displaced in this way may be difficult to connect to the electrode terminal due to a displacement, for example, in the case of connection by bolt fastening.

A technique disclosed in this specification aims to provide a battery wiring module in which a displacement between a detection wire and a terminal is unlikely even if the detection wire is pulled.

SUMMARY

This specification is directed to a battery wiring module to be mounted on a unit cell group formed by arranging unit cells including positive and negative electrode terminals. The battery wiring module includes a terminal to be electrically connected to the electrode terminal. A detection wire is provided for detecting a state of the unit cell by being electrically connected to the terminal. A resin protector also is provided and includes a terminal accommodating portion for accommodating the terminal, a wire accommodation groove for accommodating the detection wire and a through groove allowing communication between the terminal accommodating portion and the wire accommodation groove and used to pull out the detection wire connected to the terminal into the wire accommodation groove. The detection wire is bent at least at two or more positions in the wire accommodation groove or the through groove and held in a bent state while being routed in the resin protector.

According to the above-described configuration, the detection wire is bent at least at two or more positions and held in that bent state. Thus, a movement of the detection wire along a routing direction of the detection wire is suppressed and a displacement of the terminal connected to the detection wire also is suppressed. Thus, the efficiency of an operation of assembling of the battery wiring module with the unit cell group can be improved.

The through groove may include a first bent portion and a second bent portion, and the detection wire may be bent in the first and second bent portions.

The wire accommodation groove may include two groove walls and a bottom portion. Two curved ribs may extend in a direction intersecting with an extending direction of the wire accommodation groove on a plane along the bottom portion to project on the bottom portion, and a pressing piece for suppressing the protrusion of the detection wire routed in the wire accommodation groove from the wire accommodation groove may be provided to project from the groove wall between the curved ribs in the extending direction of the wire accommodation groove. By these configurations, the detection wire can be bent at least at two or more positions and held in that bent state in the resin protector.

The terminal may be held movably in the terminal accommodating portion. According to this configuration, manufacturing tolerances and assembling tolerances of the unit cell group and the battery wiring module can be absorbed and electrical connection can be performed reliably.

According to this specification, a battery wiring module is obtained in which a displacement between a detection wire and a terminal is unlikely to occur even if the detection wire is pulled.

DETAILED DESCRIPTION

Figure 1:
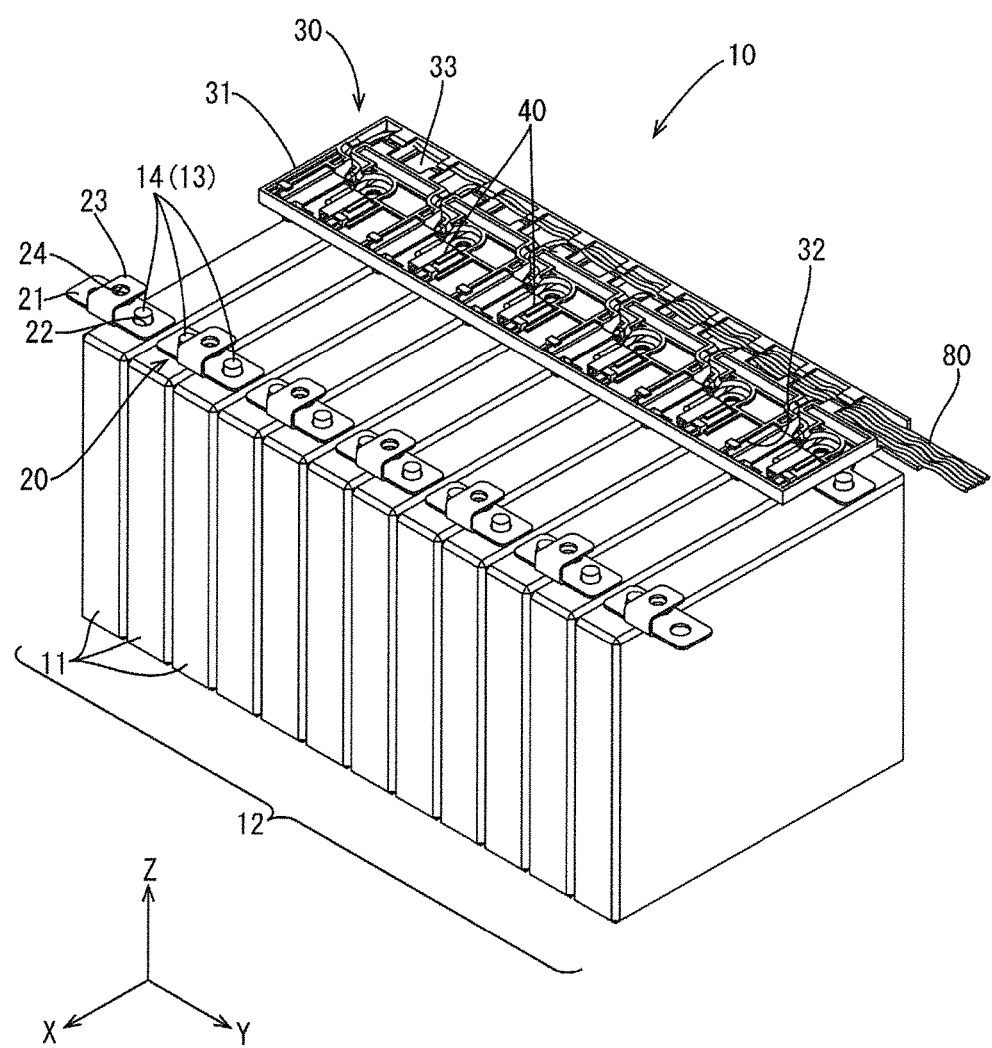
FIG. 1 is a perspective view of a battery wiring module of one embodiment.

One embodiment in which a battery wiring module 30 described in this specification is applied to a battery module 10 is described with reference to FIGS. 1 to 20.

The battery module 10 according to this embodiment is installed in a vehicle (not shown) such as an electric or hybrid vehicle and used as a power supply for driving the vehicle. The battery module 10 includes a unit cell group 12 in which a plurality of unit cells 11 having positive and negative electrode terminals 13 are arranged side by side. A plurality of adjacent electrode terminals 13 are electrically connected by busbars 20 (see FIG. 1).

In the following description, an X direction in FIG. 1 is referred to as a forward direction and a direction opposite to the X direction is referred to as a rearward direction. Further, a Y direction in FIG. 1 is referred to as a rightward direction and a direction opposite to the Y direction is referred to as a leftward direction. Furthermore, a Z direction in FIG. 1 is referred to as an upward direction and a direction opposite to the Z direction is referred to as a downward direction.

(Unit Cell 11)

As shown in FIG. 1, the unit cell 11 has a flat and substantially rectangular parallelepiped shape. An unillustrated power generating element is accommodated in the unit cell 11. A pair of electrode terminals 13, 13 are formed to project upward at positions near both ends in a longitudinal direction on the upper surface of the unit cell 11. The upper surface of the unit cell 11 serves as an electrode surface. One of the electrode terminals 13 is a positive electrode terminal and the other is a negative electrode terminal. The electrode terminal 13 constituting the positive electrode terminal and the electrode terminal 13 constituting the negative electrode terminal are identically shaped and sized. The electrode terminal 13 includes an electrode post 14 in the form of a round bar projecting upward from a terminal block (not shown) made of metal, and an external thread is formed on an outer surface of the electrode post 14. The unit cells 11 are arranged such that adjacent electrode terminals 13 have different polarities. The plurality of unit cells 11 are arranged side by side in a Y-axis direction in FIG. 1 to configure the unit cell group 12. The adjacent unit cells 11 are electrically connected by the busbars 20.

(Busbar 20)

The busbar 20 is formed by press-working a metal plate material such as copper, copper alloy, stainless steel (SUS) or aluminum into a predetermined shape and includes, as shown in FIG. 1, a plate-like body portion 21 having a substantially rectangular shape and an L-shaped terminal unit connecting portion 23 formed to stand up from a central part of one of a pair of long side edges of the body portion 21. Metal such as tin or nickel may be plated on the surface of the busbar 20.

A pair of circular terminal through holes 22 through which the electrode posts 14 of the positive and negative electrode terminals 13 of the unit cells 11 are inserted are formed to penetrate through the plate surfaces of the body portion 21 of the busbar 20. These terminal through holes 22 are set to be slightly larger in diameter than the electrode posts 14. By threadably engaging a nut (not shown) with the electrode post 14 passed through the terminal through hole 22 and sandwiching the body portion 21 between the nut and the terminal block, the electrode terminal 13 and the busbar 20 are electrically connected.

Further, a circular bolt through hole 24 through which a connection bolt (not shown) is to be inserted is formed to penetrate through the plate surfaces of a part of the terminal unit connecting portion 23 arranged to face the body portion 21.

(Battery Wiring Module 30)

The battery wiring module 30 includes a plurality of terminal units 40 to be described later, a plurality of detection wires 80 to be connected to these terminal units 40 and a resin protector 31 made of synthetic resin and having a plurality of unit holding portions 32 for holding the terminal units 40 and a wire accommodation groove 33 for accommodating the detection wires 80 (see FIG. 4).

(Resin Protector 31)

As shown in FIG. 1, the resin protector 31 is shaped to be long and narrow in an arrangement direction (Y direction) of the unit cells 11.

Figure 2:
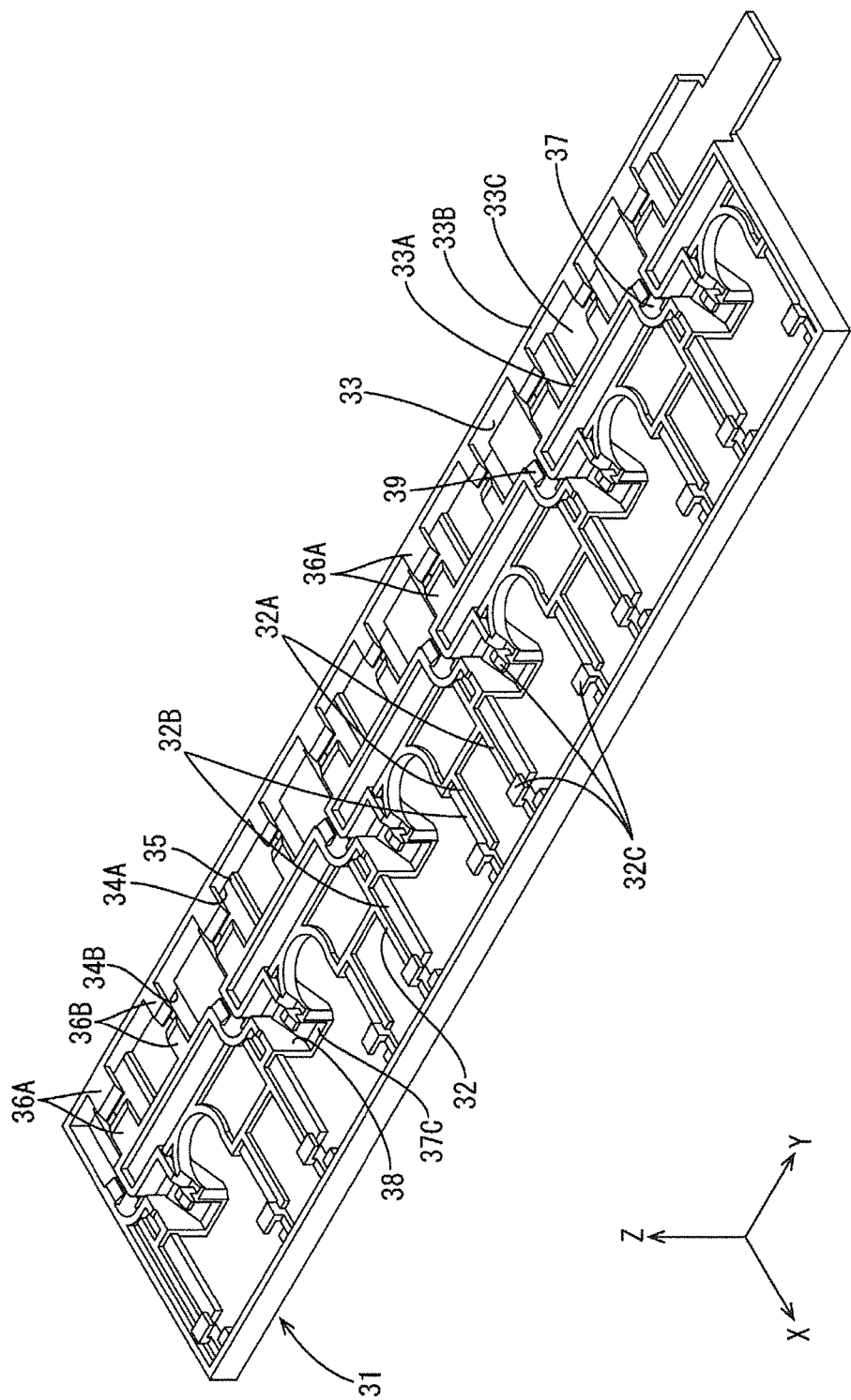
FIG. 2 is a perspective view of a resin protector.
Figure 3:
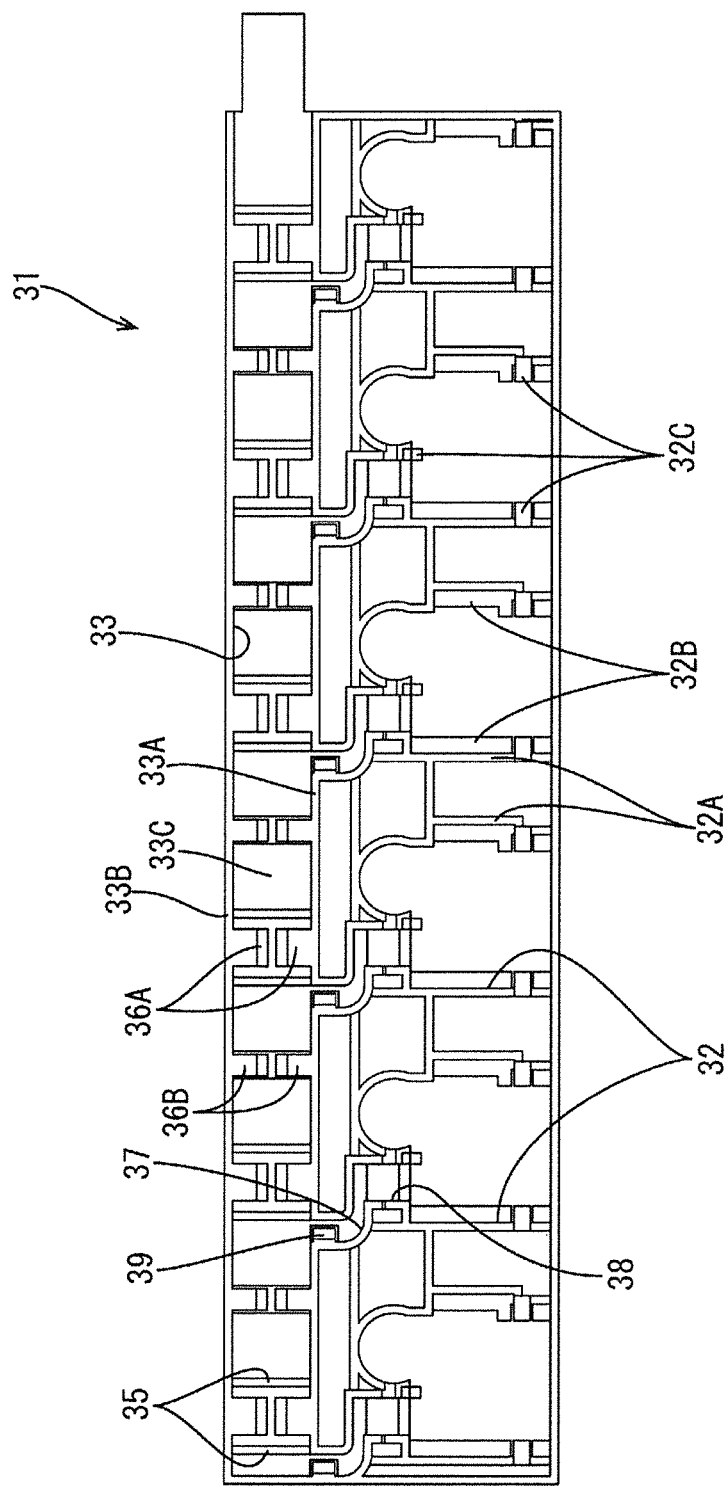
FIG. 3 is a plan view of the resin protector.

As shown in FIGS. 2 and 3, in the resin protector 31, the plurality of unit holding portions 32 (an example of a terminal accommodating portion) open on one surface side (upper surface) and configured to accommodate and hold the terminal units 40 are provided side by side in a longitudinal direction and the wire accommodation groove 33 for accommodating the detection wires 80 connected to the terminal units 40 is provided along an arrangement direction (Y direction) of the unit holding portions 32.

Each unit holding portion 32 is enclosed by a holding wall 32A standing upward and accommodating and holding the terminal unit 40 inside. The holding wall 32A is arranged into a shape in conformity with an outer shape of the terminal unit 40. Inner dimensions of the unit holding portion 32 (holding wall 32A) are set to be slightly larger than outer shape dimensions of the terminal unit 40, so that the terminal unit 40 accommodated in the unit holding portion 32 is movable in horizontal directions (X, Y directions) in the unit holding portion 32 (see FIGS. 4 and 5).

A bottom part of the unit holding portion 32 is open downward except at a pair of placing portions 32B on which a pair of edge parts of the bottom surface of the terminal unit 40 are to be placed. These placing portions 32B are provided on parts of the holding wall 32A located on left and right sides of the unit holding portion 32 in FIG. 3.

Further, three L-shaped holding protrusions 32C arranged above the terminal unit 40 accommodated in the unit holding portion 32 and having a function of holding the terminal unit 40 together with the placing portions 32B are formed on the holding wall 32A to project inwardly of the unit holding portion 32. These holding protrusions 32C are provided on the upper ends of the parts of the holding wall 32A located on the left and right sides of the unit holding portion 32 and a part of the holding wall 32A located on an upper side in FIG. 3.

The wire accommodation groove 33 includes a pair of groove wall portions 33A, 33B and a bottom portion 33C, and is provided along the arrangement direction (Y direction) of the unit holding portions 32. A plurality of detection wires 80 can be accommodated into this wire accommodation groove 33.

Parts of the groove wall portion 33A on the side of the unit holding portions 32 out of the pair of groove wall portions 33A, 33B of this wire accommodation groove 33, and parts of the holding walls 32A of the unit holding portions 32 on the side of the wire accommodation groove 33 are both cut and communicate with through grooves 37 located between the wire accommodation groove 33 and the unit holding portions 32 and enabling the detection wires 80 to be introduced into the wire accommodation groove 33 from the side of the unit holding portions 32.

Figure 5:
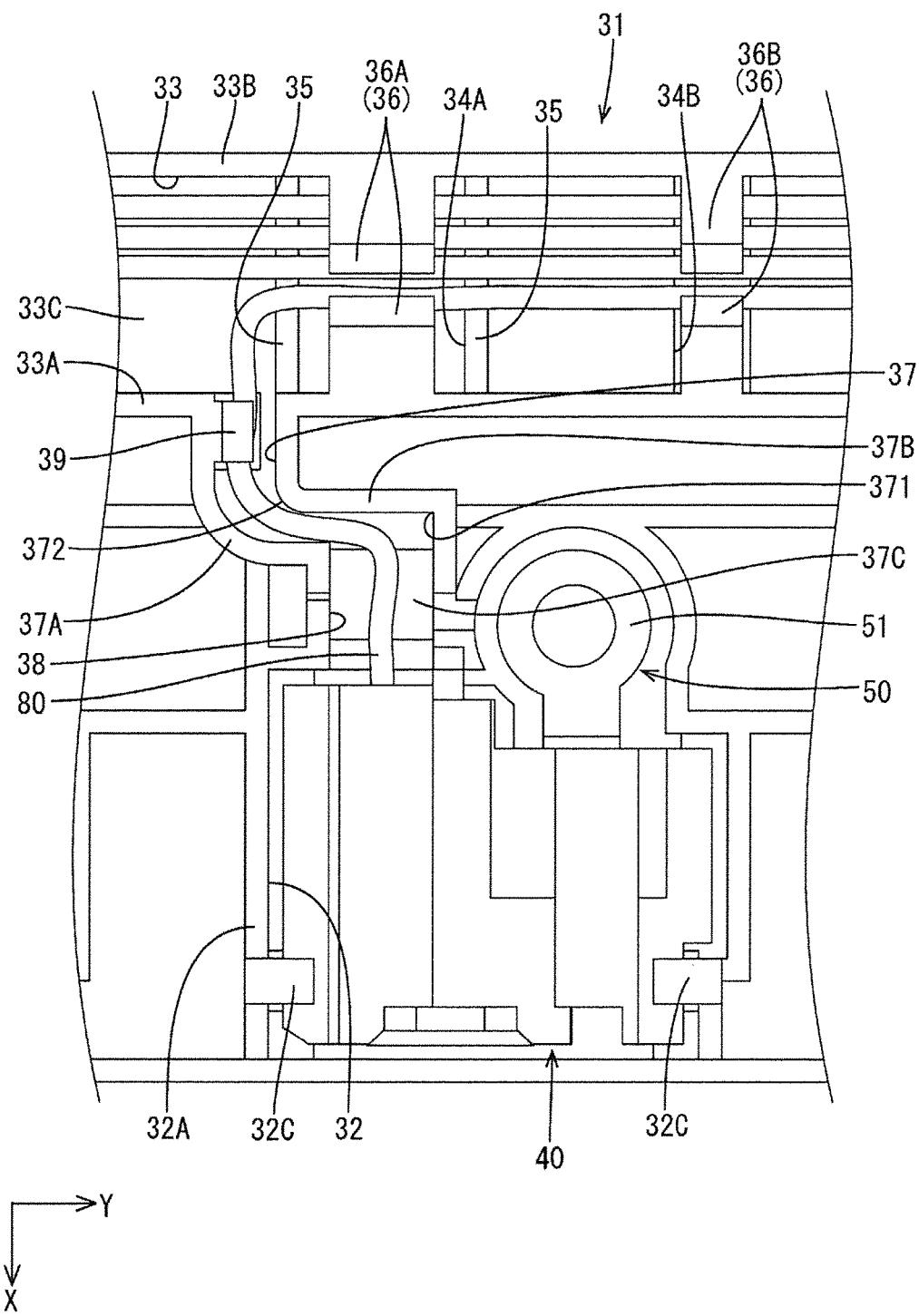
FIG. 5 is a partial enlarged plan view of the battery wiring module.

As shown in FIG. 5, this through groove 37 is composed of a pair of groove wall portions 37A, 37B and a bottom portion 37C, is Z-shaped in a plan view by being bent substantially at a right angle at two positions after extending from the unit holding portion 32 toward the wire accommodation groove 33, and communicates with the wire accommodation groove 33 in a direction perpendicular to an extending direction (Y direction) of the wire accommodation groove 33. A bent portion located on a lower side in FIG. 5 (bent portion on the side of the unit holding portion 32) is referred to as a first bent portion 371 and a bent portion located on an upper side (bent portion on the side of the wire accommodation groove 33) is referred to as a second bent portion 372 below. In this embodiment, the groove wall portions 37A, 37B are angularly bent at a right angle in the first bent portion 371, whereas corner parts are in the form of curved surfaces in the second bent portion 372.

A part of the through groove 37 closer to the unit holding portion 32 than the first bent portion 371 serves as a wide portion 38 set to have a larger groove width than the other part (on the side of the wire accommodation groove 33). The detection wire 80 inserted into the through groove 37 can move and be curved in horizontal directions (X, Y directions) in the wide portion 38.

As shown in FIG. 2, an area of the bottom portion 37C of the through groove 37 corresponding to the wide portion 38 is formed into an inclined surface, and an end part of this inclined surface on the side of the unit holding portion 32 is inclined obliquely downwardly toward the electrode surface to guide the detection wire 80 drawn out from the terminal unit 40 toward the wire accommodation groove 33 while supporting the detection wire 80 from below.

A pressing piece 39 for preventing the protrusion of the detection wire 80 by covering a part of the through groove 37 from above is provided to project toward the other groove wall portion 37B on the upper end of an end part on the wire accommodation groove 33 of the groove wall portion 37A arranged on an outer side (left side in FIG. 5) of the second bent portion 372 out of the pair of groove wall portions 37A, 37B.

On the other hand, pairs of pressing pieces 36 for preventing the protrusion of the detection wires 80 by covering parts of the wire accommodation groove 36 from above are provided at a multitude of positions facing each other also on the upper ends of the pair of groove wall portions 33A, 33B of the wire accommodation groove 33.

These pairs of pressing pieces 36 are provided at two positions in an area of the wire accommodation groove 33 corresponding to one unit holding portion 32 as shown in FIG. 5. Out of those, the pair of pressing pieces 36A located on the side of the through groove 37 (left side in FIG. 5) are formed to be wider than the pair of pressing pieces 36B on the other side.

Further, areas of the bottom portion 33C of the wire accommodation groove 33 facing the pressing pieces 36A, 36B and peripheral areas thereof are formed into openings 34A, 34B open downward. Furthermore, curved ribs 35 projecting upward (Z direction) are provided entirely over a pair of edge parts extending in a direction (X direction) intersecting with the extending direction (Y direction) of the wire accommodation groove 33 along the pair of edge parts out of edge parts of the opening 34A located on the side of the through groove 37 (see FIG. 6). In other words, the pair of pressing pieces 36A are arranged between the pair of curved ribs 35 in the extending direction (Y direction) of the wire accommodation groove 33.

A distance from the upper surfaces of this pair of curved ribs 35 to the lower surfaces of the pair of pressing pieces 36A is longer than a diameter of the detection wire 80 and shorter than twice the diameter.

(Terminal Unit 40)

The terminal unit 40 (an example of a terminal) for detecting a voltage of the unit cell 11 by being connected to the busbar 20 is arranged in the unit holding portion 32 of the resin protector 31.

The terminal unit 40 is formed such that a busbar connection terminal 50 to be connected to the busbar 20, a wire connection terminal 60 to be connected to an end part of the detection wire 80 and a fuse 70 for electrically connecting the busbar connection terminal 50 and the wire connection terminal 60 are integrally assembled and accommodated in a housing 45 made of synthetic resin (see FIGS. 7 to 11).

(Busbar Connection Terminal 50)

The busbar connection terminal 50 is formed by press-working a metal plate material such as copper, copper alloy, stainless steel or aluminum into a predetermined shape. The busbar connection terminal 50 detects a state of the unit cell 11 by being electrically connected to the busbar 20.

Figure 12:
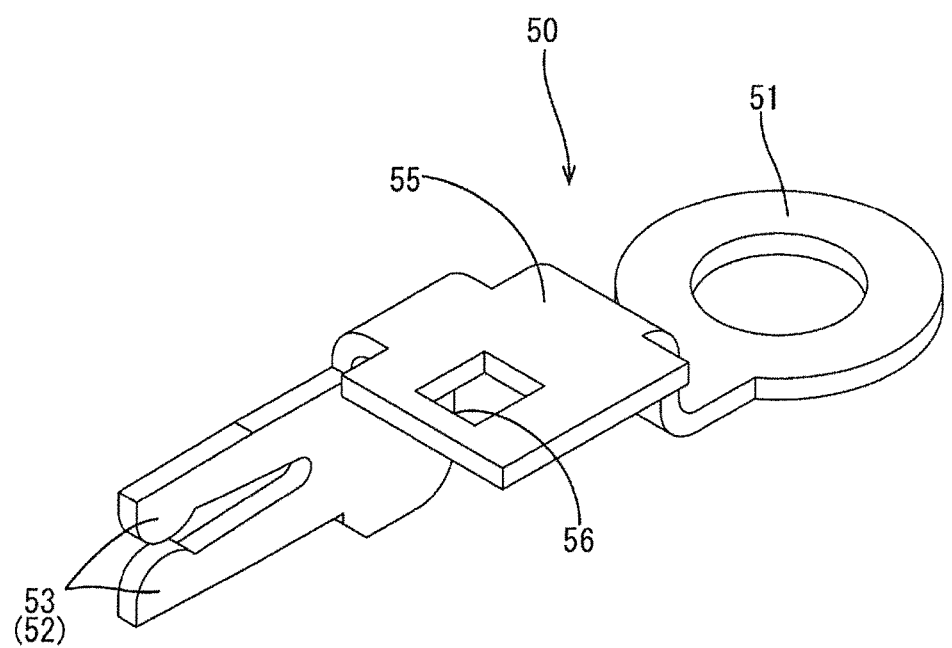
FIG. 12 is a perspective view of a busbar connection terminal.

As shown in FIG. 12, the busbar connection terminal 50 is formed such that a busbar connecting portion 51 in the form of a round terminal to be electrically connected to the terminal unit connecting portion 23 of the busbar 20 described above by fastening a bolt and a nut (not shown) and a fuse receiving portion 52 to be connected to the fuse 70 extend toward mutually opposite sides from a linking portion 55 in the form of a flat plate.

The fuse receiving portion 52 is composed of a pair of clamping pieces 53 so-called a tuning fork terminal formed by forming a slot, into which a later-described fuse-side connection terminal 72 in the form of a flat plate is to be press-fit, in a leading end of a terminal in the form of a flat plate. The linking portion 55 is provided with an engaging hole 56 used to mount the busbar connection terminal 50 into the housing 45 to be described later.

(Wire Connection Terminal 60)

Figure 13:
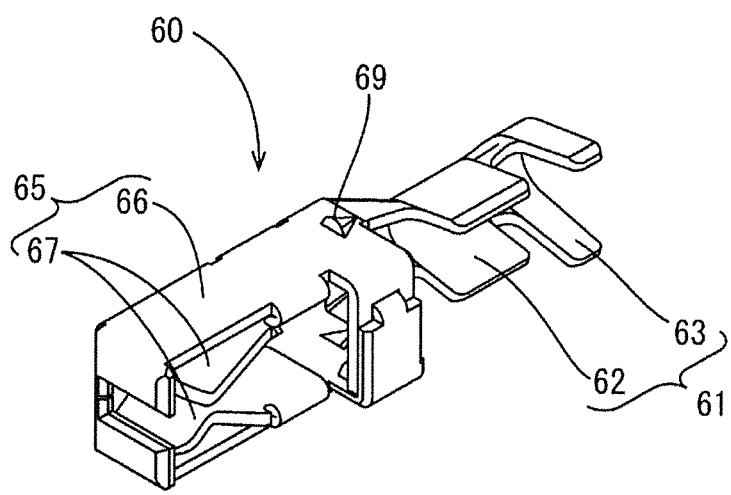
FIG. 13 is a perspective view of a wire connection terminal.

As shown in FIG. 13, the wire connecting portion 60 is formed such that a wire connecting portion 61 to be connected to the end part of the detection wire 80 and a fuse receiving portion 65 to be connected to the fuse 70 extend toward mutually opposite sides.

The wire connecting portion 61 is composed of a core connecting portion 62 in the form of a barrel to be crimped to an exposed core (not shown) of the detection wire 80 and a holding portion 63 in the form of a barrel provided at a leading end side of the core connecting portion 62 and to be crimped to the periphery of a part of the detection wire 80 covered with an insulation coating.

On the other hand, the fuse receiving portion 65 is provided with a pair of resilient contact pieces 67 capable of resiliently contacting the fuse-side connection terminal 72 in the form of a flat plate inside a rectangular tube portion 66 having a rectangular tube shape. Further, a locking projection 69 to be mounted into the housing 45 to be described later is provided on an outer surface of the rectangular tube portion 66.

(Fuse 70)

Figure 14:
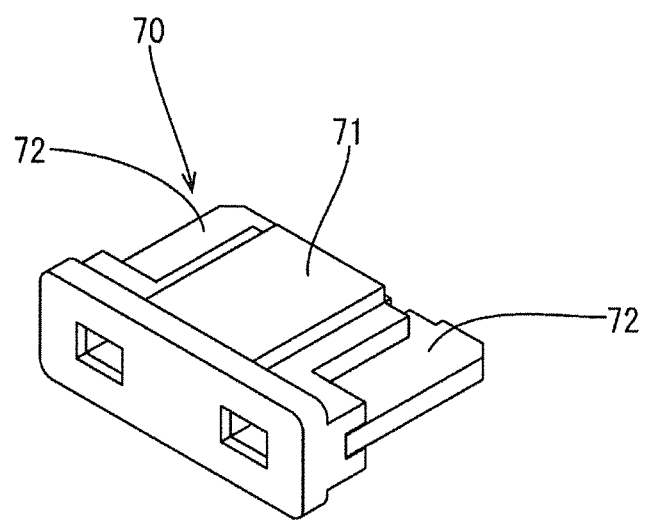
FIG. 14 is a perspective view of a fuse.
Figure 15:
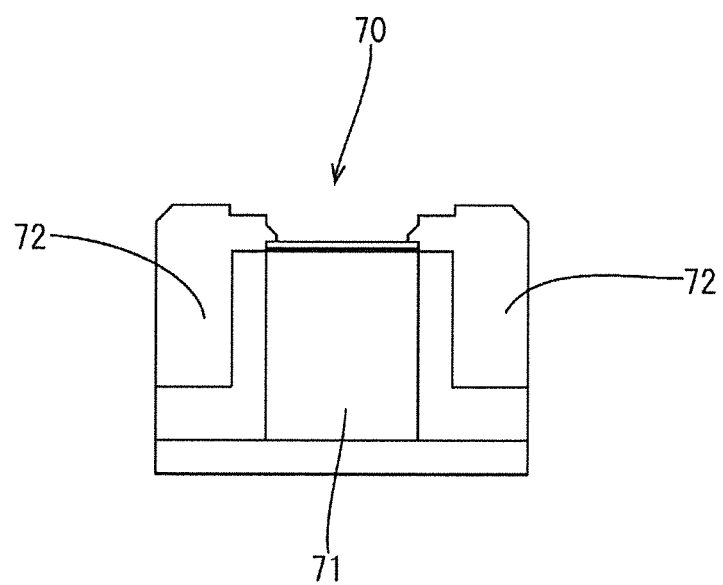
FIG. 15 is a plan view of the fuse.
Figure 16:
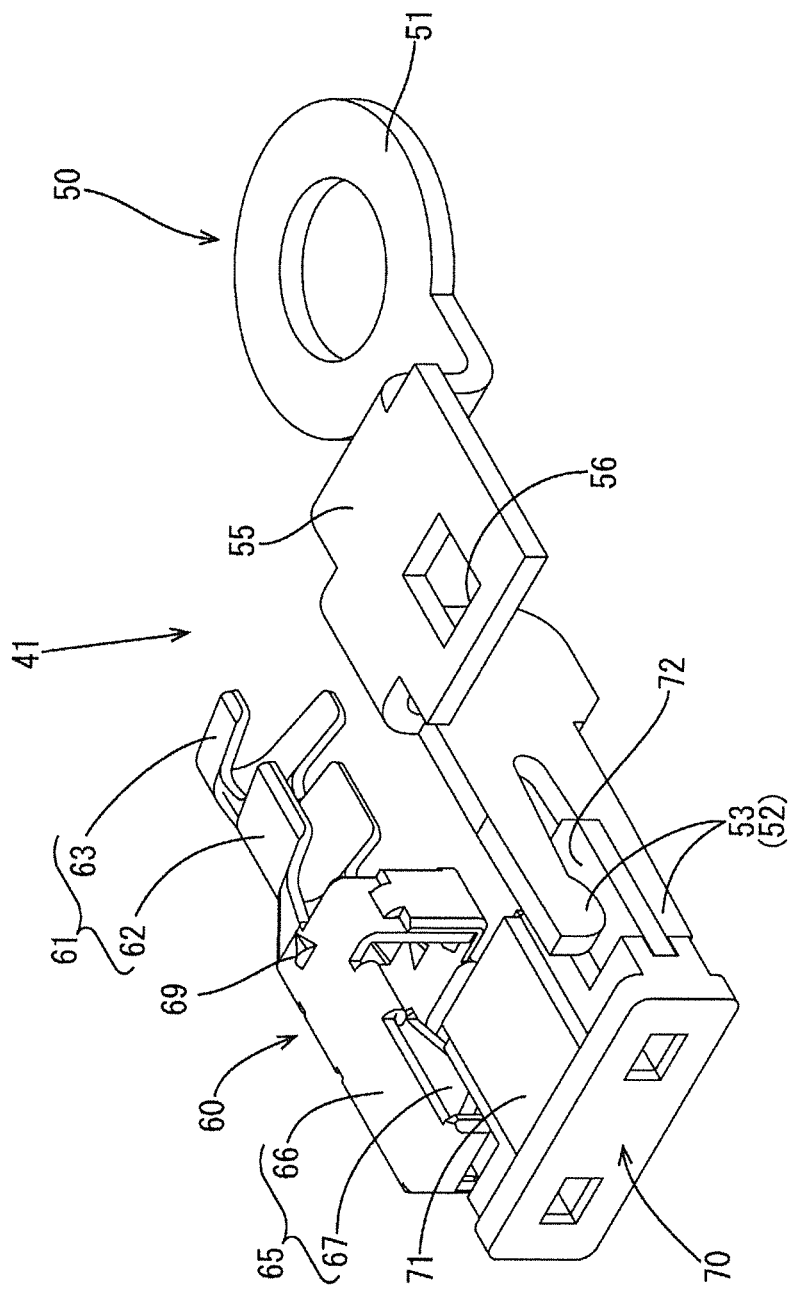
FIG. 16 is a perspective view of an assembly.
Figure 17:
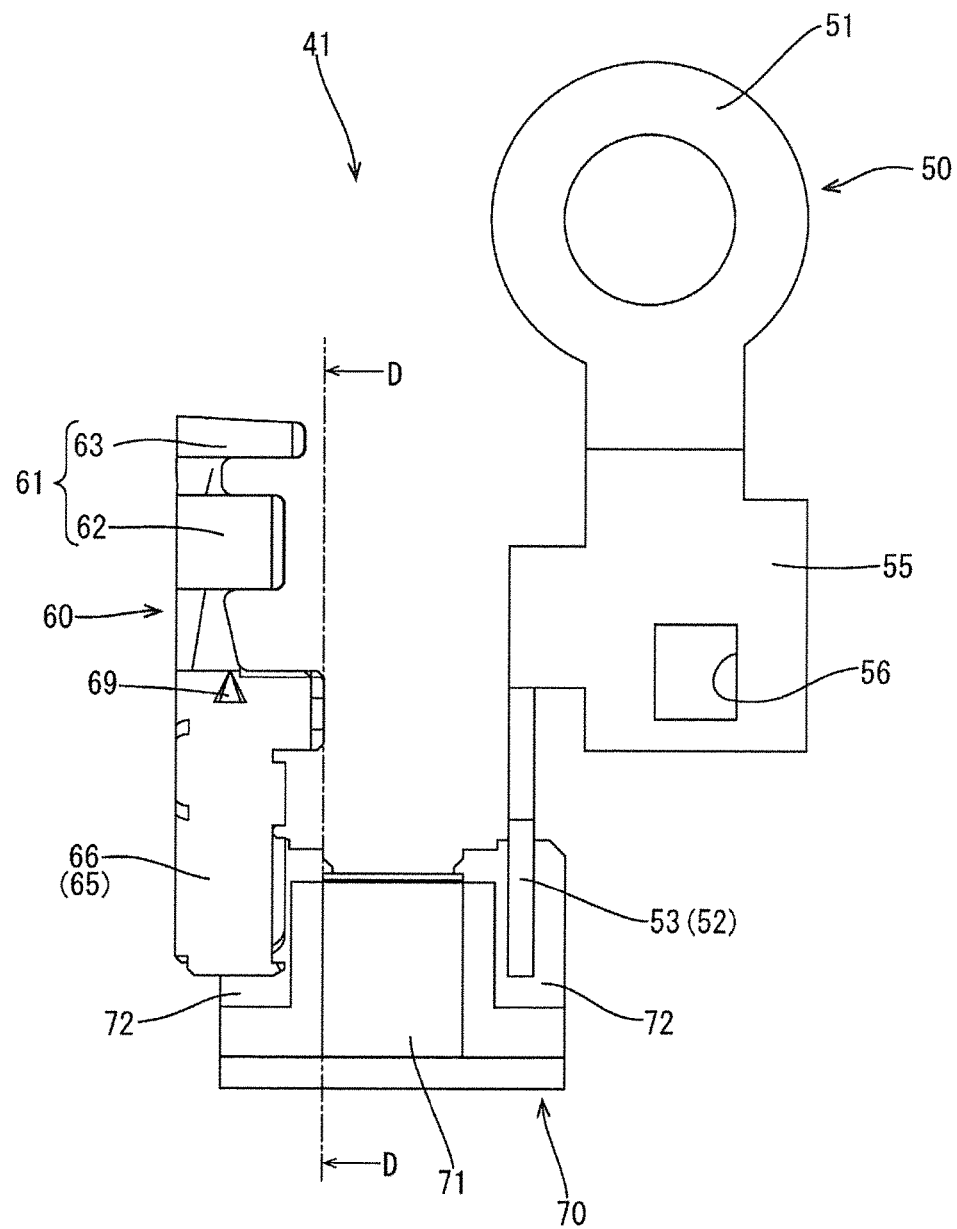
FIG. 17 is a plan view of the assembly.
Figure 18:
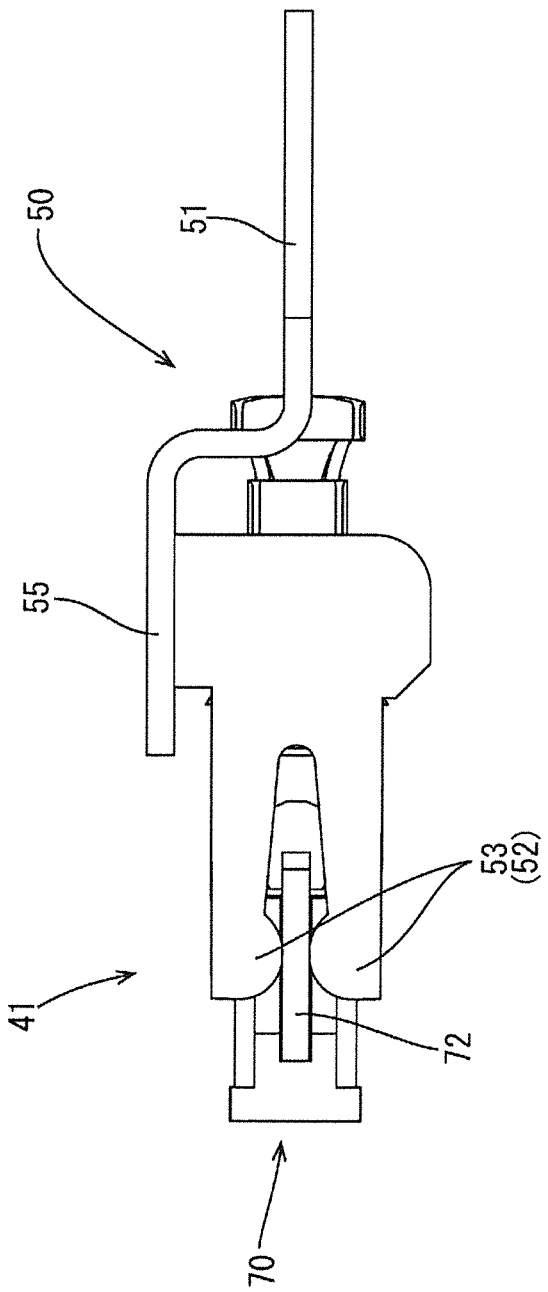
FIG. 18 is a right side view of the assembly.
Figure 19:
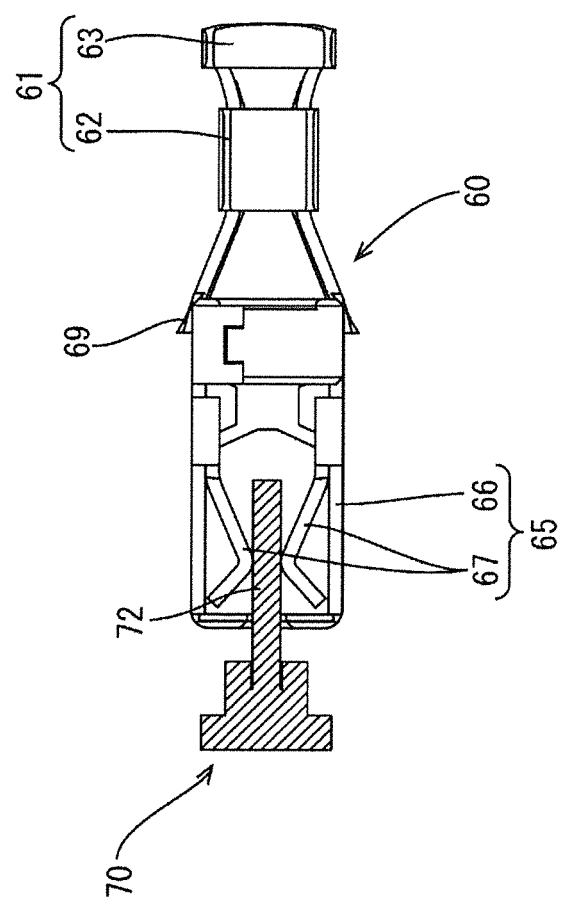
FIG. 19 is a section along D-D of FIG. 17.

As shown in FIGS. 14 and 15, the fuse 70 is, for example, a general-purpose article of such a type that a pair of fuse-side connection terminals 72 are exposed from both sides of a resin holder 71 T-shaped in a plan view. The fuse-side connection terminals 72 are inserted and clamped between the pair of clamping pieces 53 of the fuse receiving portion 52 of the busbar connection terminal 50 and between the pair of resilient contact pieces 67 of the fuse receiving portion 65 of the wire connecting portion 60 while resiliently deforming the clamping pieces 53 and the resilient contact pieces 67 outwardly (see FIGS. 18 and 19).

The integral assembly of these busbar connection terminal 50, wire connection terminal 60 and fuse 70 is called an assembly 41 below (see FIGS. 16 to 19).

(Housing 45)

Figure 20:
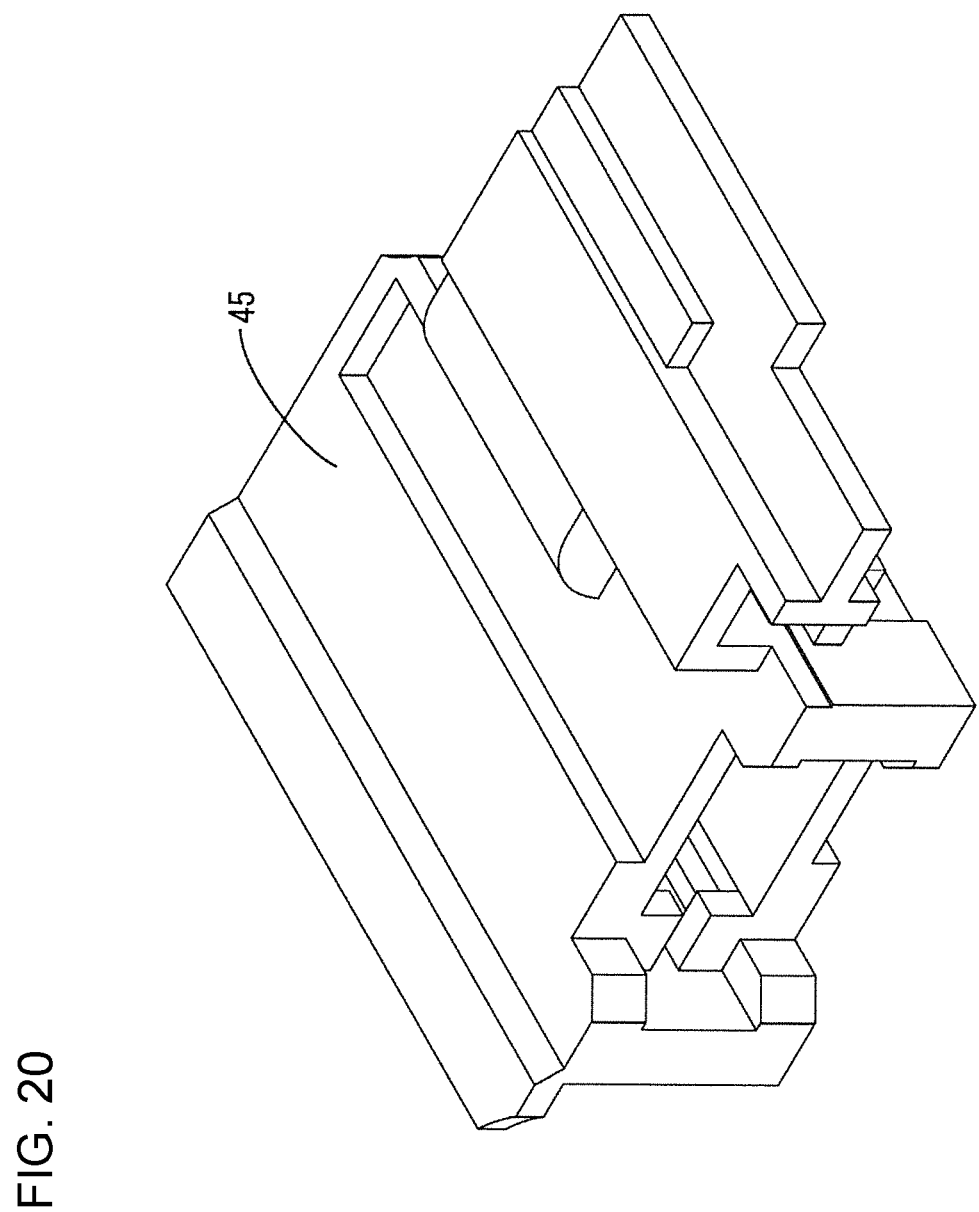
FIG. 20 is a perspective view of a housing.

The housing 45 is made of synthetic resin and formed into a casing shape shown in FIG. 20 and the aforementioned assembly 41 can be accommodated into the housing 45. An engaging protrusion 46 (see FIG. 10) engageable with the engaging hole 56 of the aforementioned busbar connection terminal 50 and a locking protrusion 47 (see FIG. 11) lockable to the back surface of the rectangular tube portion 66 of the wire connection terminal 60 are provided inside the housing 45. These engaging protrusion 46 and locking protrusion 47 are engaged with and locked to the engaging hole 56 of the busbar connection terminal 50 and the rectangular tube portion 66 of the wire connection terminal 60, whereby the assembly 41 is retained in the housing 45.

The assembly 41 is accommodated into the housing 45, thereby forming the terminal unit 40 (see FIGS. 7 to 11).

(Assembling Method of Battery Module 10)

In assembling the aforementioned battery module 10 of this embodiment, the plurality of terminal units 40 connected to the detection wires 80 are accommodated into the unit holding portions 32 of the resin protector 31 and the detection wires 80 drawn out from the terminal units 40 are introduced and arranged into the wire accommodation groove 33 through the through grooves 37.

At this time, since the holding walls 32A of the unit holding portions 32 and the terminal units 40 are so dimensioned that tiny clearances are formed between the inner surfaces of the holding walls 32A of the unit holding portions 32 and the terminal units 40, the terminal units 40 are slightly movable in the horizontal directions (X, Y directions) in the unit holding portions 32.

Further, since the part of the through groove 37 on the side of the unit holding portion 32 serves as the wide portion 38 set to have a large groove width, the detection wire 80 can slightly move and be curved in the horizontal directions (X, Y directions) together with the terminal unit 40 in the wide portion 38.

Figure 4:
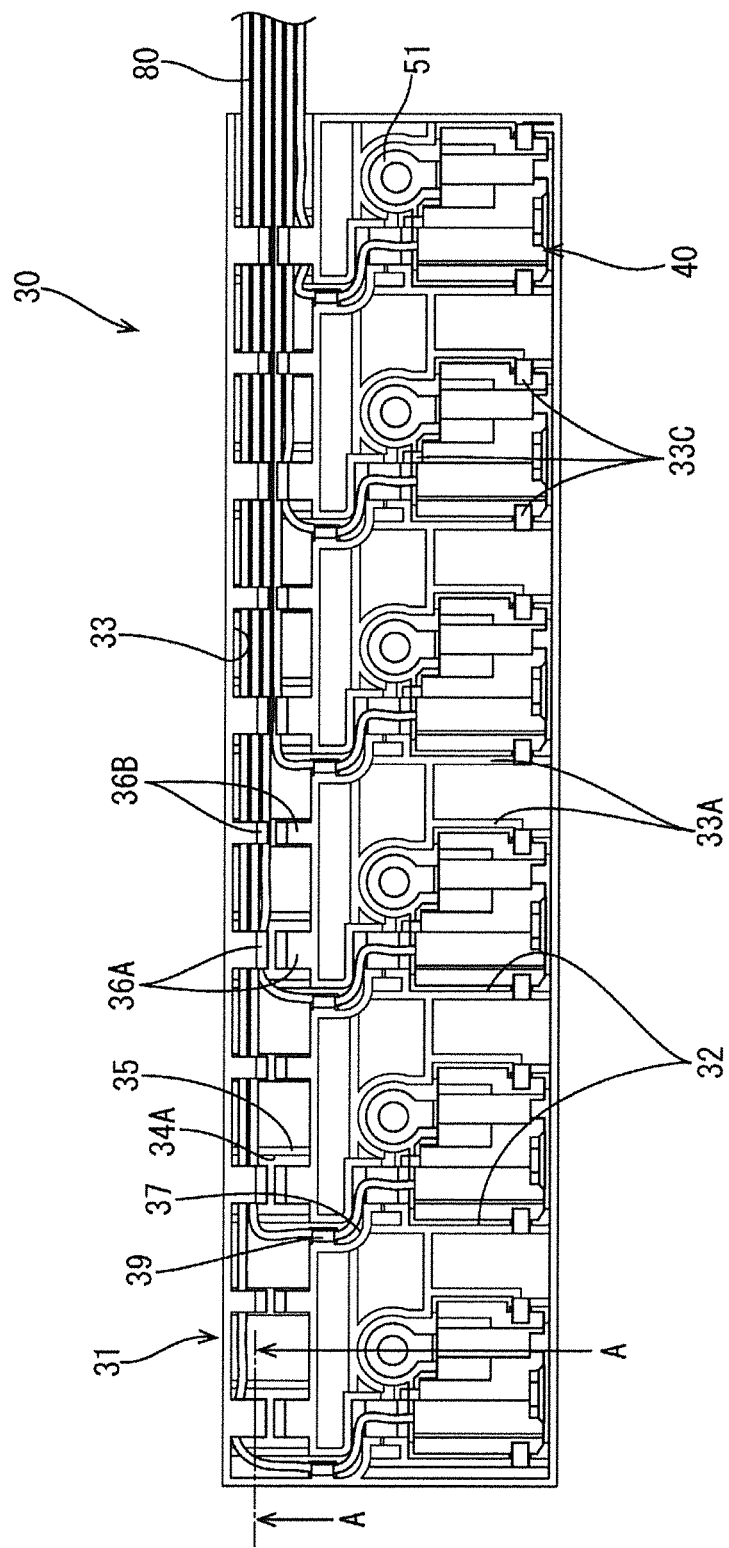
FIG. 4 is a plan view of the battery wiring module.

As shown in FIGS. 4 and 5, the detection wire 80 is routed and held in the through groove 37 while being bent substantially at a right angle at two positions by the first and second bent portions 371, 372, and introduced into the wire accommodation groove 33. Then, the detection wire 80 introduced in the direction perpendicular to the extending direction (Y direction) of the wire accommodation groove 33 is bent substantially at a right angle in the wire accommodation groove 33 to extend along the extending direction (Y direction) of the wire accommodation groove 33 and routed in the wire accommodation groove 33.

Figure 6:
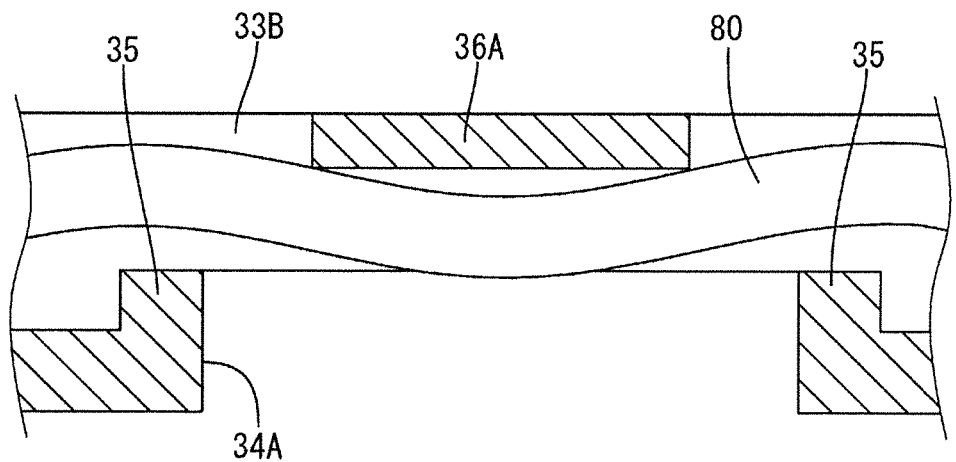
FIG. 6 is a section along A-A of FIG. 4.
Figure 7:
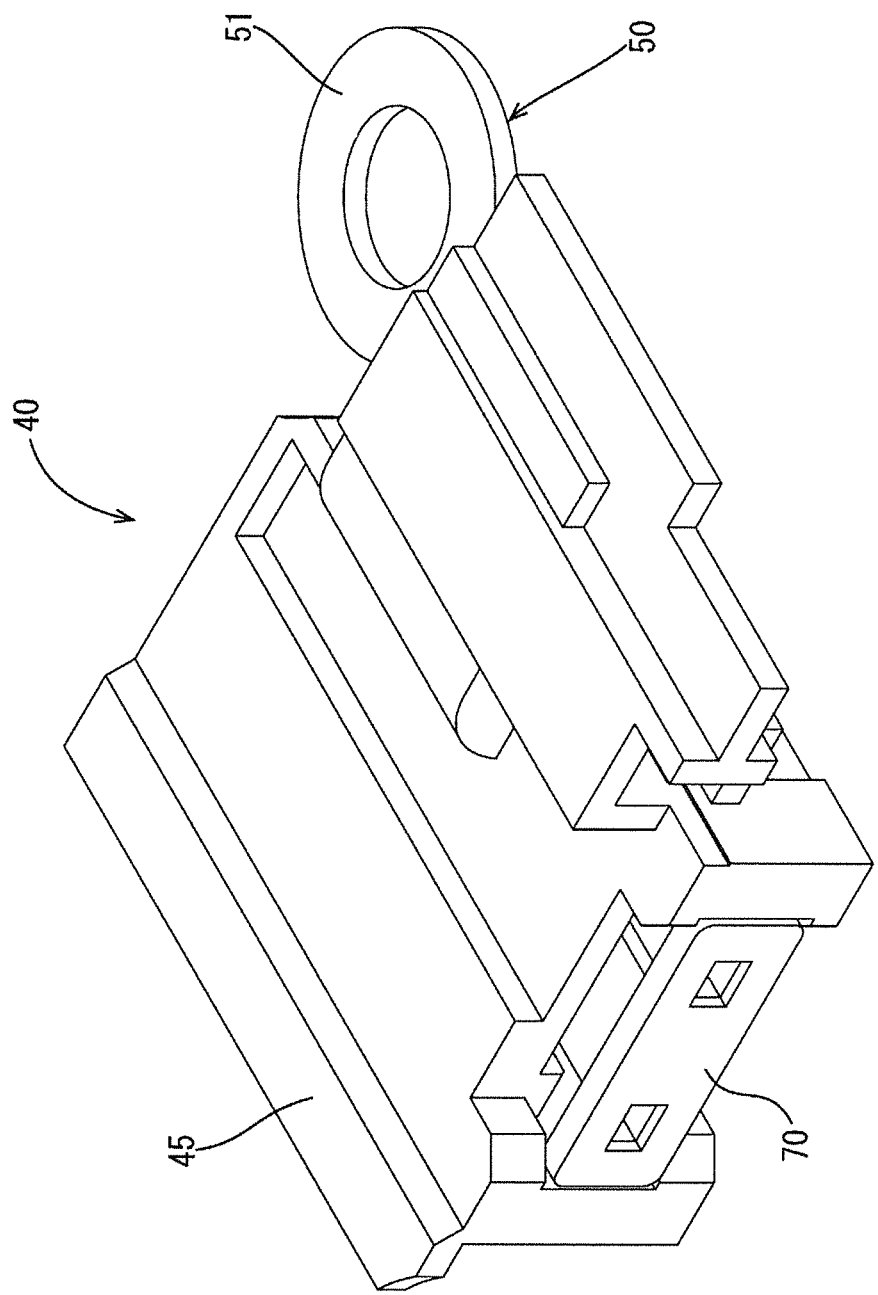
FIG. 7 is a perspective view of a terminal unit.
Figure 8:
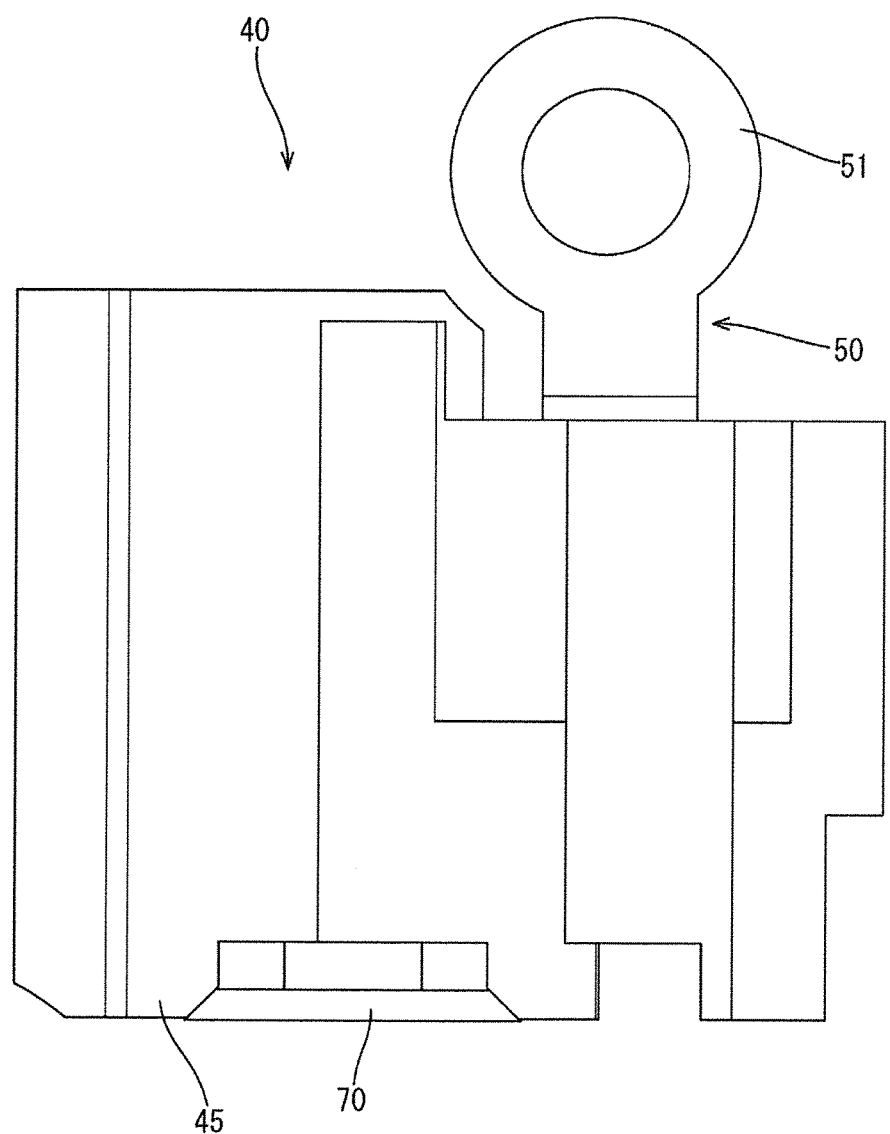
FIG. 8 is a plan view of the terminal unit.
Figure 9:
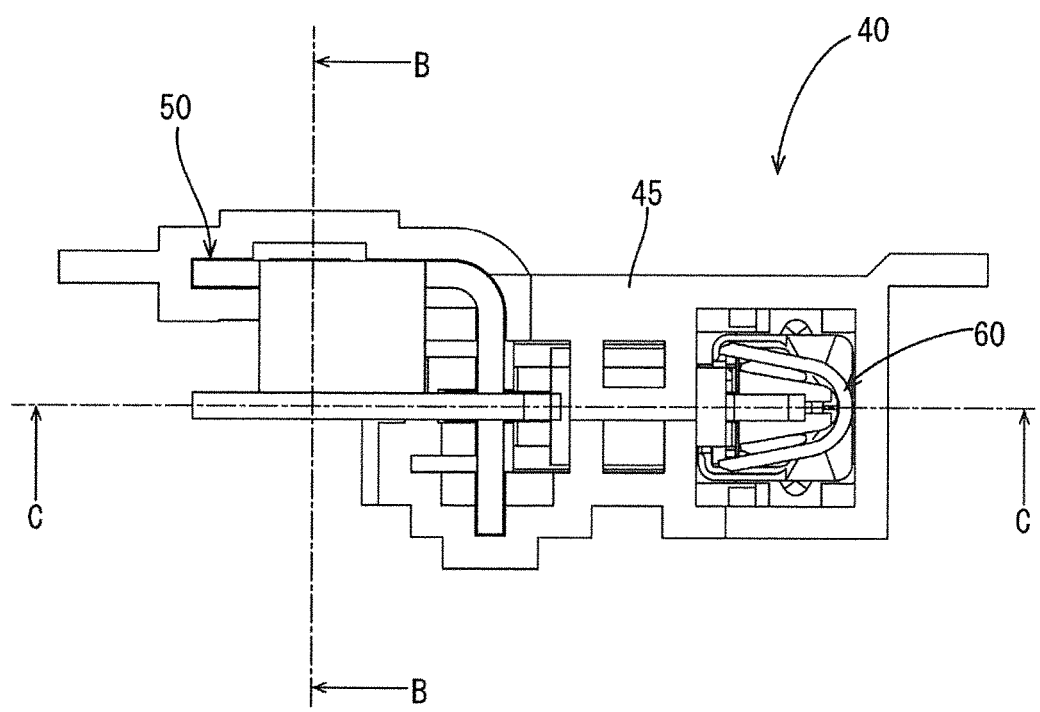
FIG. 9 is a back view of the terminal unit.
Figure 10:
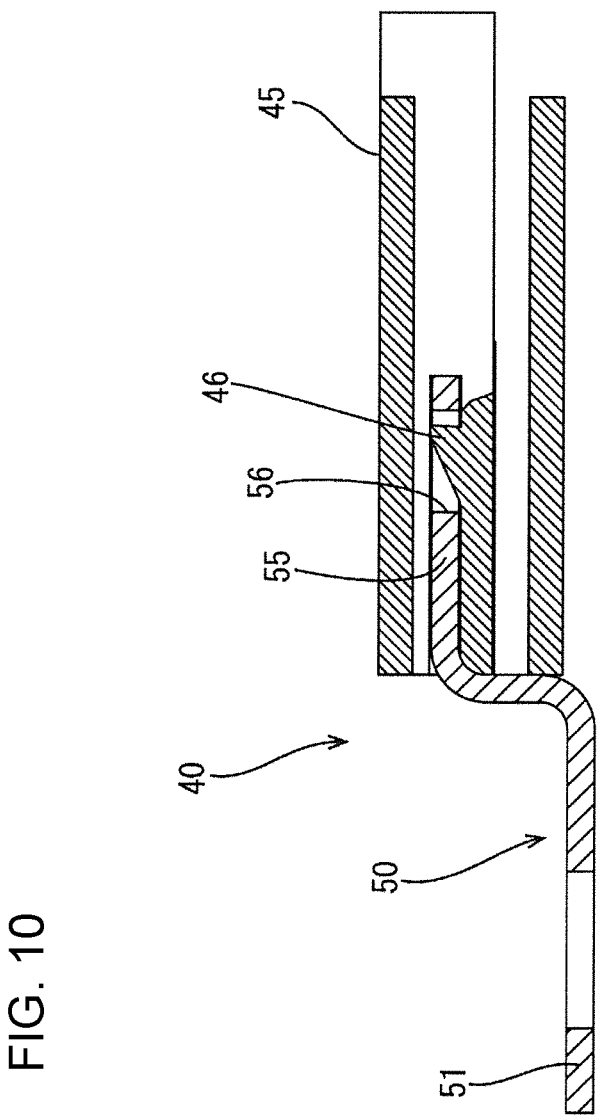
FIG. 10 is a section along A-A of FIG. 9.
Figure 11:
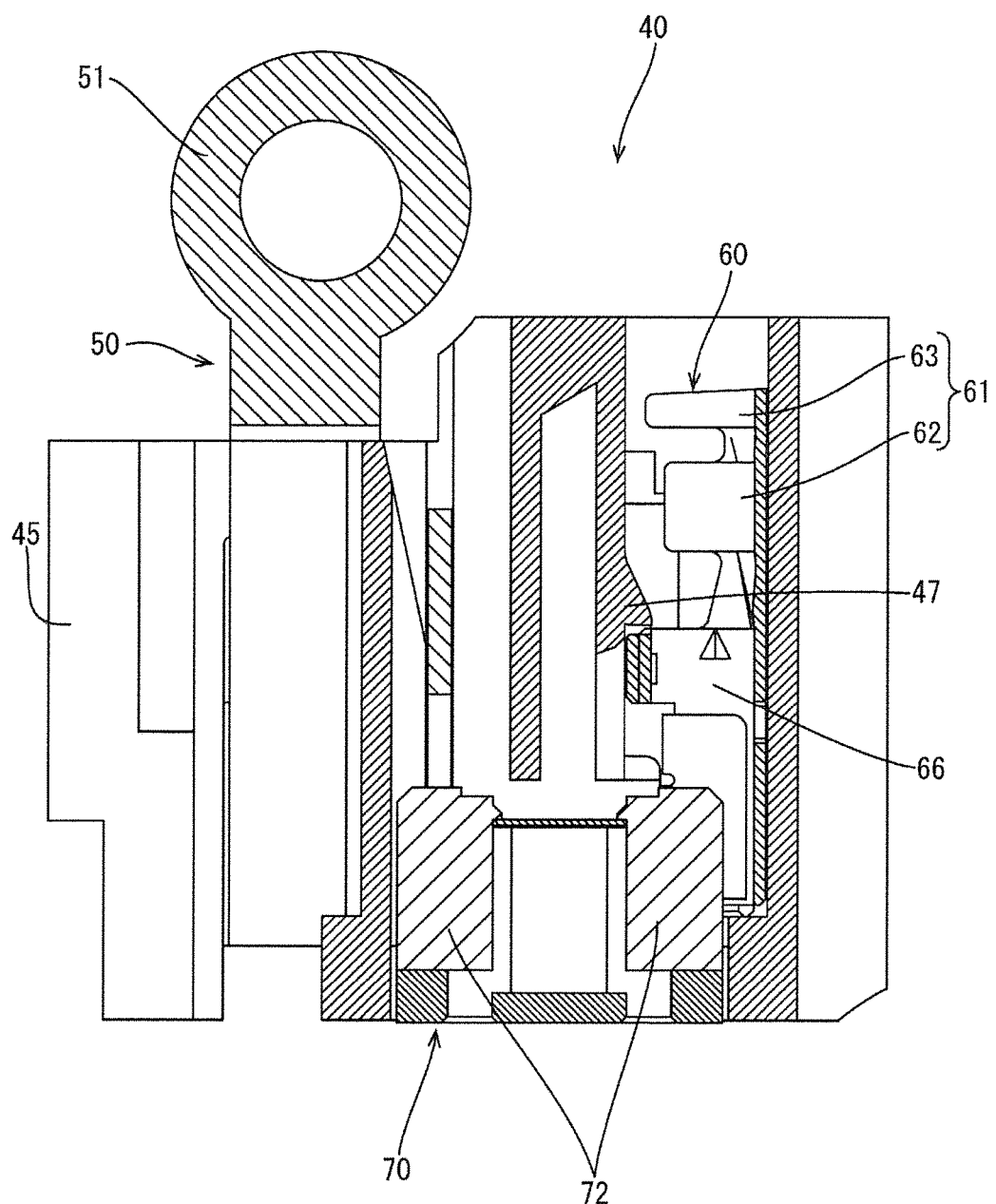
FIG. 11 is a section along B-B of FIG. 9.

At this time, the detection wire 80 is pushed upwardly by the curved rib 35 located on the left side in FIGS. 5 and 6, then pushed downwardly by the pressing pieces 36A and subsequently pushed upwardly by the curved rib 35 located on the right side, thereby being curved in the vertical direction (Z direction) in the wire accommodation groove 33 and held in that curved state.

In this way, the battery wiring module 30 is completed.

Subsequently, the battery wiring module 30 assembled in this way is arranged on the upper surface side of the unit cell group 12 and connected to the busbars 20 mounted in advance. Specifically, the busbar connecting portion 51 in the form of a round terminal of the terminal unit 40 is overlapped with the terminal unit connecting portion 23 of the busbar 20, the bolt is inserted and the nut is fastened, whereby the terminal unit 40 and the busbar 20 are electrically connected.

At this time, since the terminal units 40 are slightly movable in the horizontal directions (X, Y direction) in the unit holding portions 32 as described above, even if the unit cell group 12 and the busbars 20 have manufacturing tolerances and assembling tolerances, those tolerances can be absorbed.

Further, since the through groove 37 is provided with the wide portion 38, the detection wire 80 slightly moves and, depending on cases, is curved in the wide portion 37 as the terminal unit 40 moves, whereby tolerances can be similarly absorbed.

In this way, the battery module 10 is completed.

Functions and Effects of Embodiment

According to the aforementioned battery wiring module 30 of this embodiment, since the detection wire 80 is bent at two positions, i.e. at the first and second bent portions 371, 372 and held in that bent state in the through groove 37, even if the detection wire 80 is pulled with a strong force, a movement of the detection wire 80 in the through groove 37 is suppressed.

Further, since the detection wire 80 is curved in the vertical direction (Z direction) at three positions by the pair of curved ribs 35 and the pressing pieces 36A in the wire accommodation groove 33 and held in that curved state, even if the detection wire 80 is pulled with a strong force, the detection wire 80 is caught by the curved ribs 35 and the pressing pieces 36A and a movement thereof in the wire accommodation groove 33 is suppressed.

Specifically, even if the detection wire 80 is pulled from outside with a strong force, the detection wire 80 is unlikely to move and a displacement of the terminal unit 40 connected to the detection wire 80 is also suppressed. Thus, the efficiency of an operation of assembling the battery wiring module 30 with the unit cell group 12 can be improved.

Furthermore, since each terminal unit 40 is movably held in each unit holding portion 32 of the resin protector 31 and the detection wire 80 can move and be curved together with the terminal unit 40 in the wide portion 38, manufacturing tolerances and assembling tolerances can be absorbed and electrical connection can be reliably performed.

The technique disclosed in this specification is not limited to the above described and illustrated embodiment. For example, the following embodiments are also included in the technical scope.

Although the detection wire 80 is connected to the terminal unit 40 in the above embodiment, the detection wire 80 may be connected to a detection terminal made of a single metal plate or connected to a busbar integrated with a detection terminal.

Further, although the detection wire 80 is bent both in the through groove 37 and in the wire accommodation groove 33 and held in the bent state in the above embodiment, the detection wire 80 may be bent only in one of them.

Whether or not the detection wire 80 is bent at two or more positions and where the detection wire 80 is bent can be arbitrarily set.

Although the curved ribs 35 are provided along the edge parts of the opening 34A in the above embodiment, the curved ribs 35 may not necessarily be provided along the edge parts of the opening 34A. Further, the form of the curved ribs 35 is not limited to that of the above embodiment. In short, the curved ribs 35 may have any form provided that they can curve the detection wire 80 in the wire accommodation groove 33.

Although the terminal unit 40 (terminal) is held movably with respect to the resin protector 31 in the above embodiment, the terminal unit 30 may be immovably held.

The through groove 37 may be provided with curved ribs and pressing pieces.

Although an example of the terminals for detecting the voltages of the unit cells 11 is shown in the above embodiment, there is no limitation to this. For example, terminals for detecting another state of the unit cells such as currents flowing in the unit cells or temperatures may be provided.

LIST OF REFERENCE SIGNS

10: battery module
11: unit cell
12: unit cell group
13: electrode terminal
20: busbar
30: battery wiring module
31: resin protector
32: unit holding portion (terminal accommodating portion)
33: wire accommodation groove
33A, 33B: groove wall portion
33C: bottom portion
35: curved rib
36: pressing piece
37: through groove
371: first bent portion
372: second bent portion
40: terminal unit (terminal)
50: busbar connection terminal (terminal)
80: detection wire

The invention claimed is:

1. A battery wiring module to be mounted on a unit cell group formed by arranging a plurality of unit cells including positive and negative electrode terminals, comprising:
   a terminal unit to be electrically connected to the positive and negative electrode terminals;
   a detection wire for detecting a state of the unit cell by being electrically connected to the terminal unit; and
   a resin protector including a wire accommodation groove for accommodating the detection wire, the wire accommodation groove having a bottom portion and parallel first and second groove walls projecting from the bottom portion and extending in a first direction at positions spaced from one another, at least one rib projecting from the bottom portion and extending in a second direction normal to the first direction at least partially between the first and second groove walls, and at least one pressing portion projecting from at least one of the first and second groove walls at a position spaced from the bottom portion and extending in the second direction, a terminal accommodating portion for accommodating the terminal unit, and a through groove extending between the terminal accommodating portion and the wire accommodation groove and accommodating the detection wire extending from the terminal unit into the wire accommodation groove;
wherein:
   the through groove includes at least first and second bent portions extending in the first and second directions respectively so that the detection wire is bent at least at two or more positions in the through groove and held in a bent state while being routed in the resin protector; and
   the detection wire is routed over the at least one rib and under the at least one pressing portion in the wire accommodation portion so that the detection wire is bent in a wire accommodation portion bending direction transverse to the through groove bent portions.

2. The battery wiring module of claim 1, wherein the terminal unit is held movably in the terminal accommodating portion.

* * * * *